United States Patent
Liu et al.

(10) Patent No.: US 10,203,603 B2
(45) Date of Patent: Feb. 12, 2019

(54) SUBSTRATE SUPPORTING STRUCTURE AND EXPOSURE MACHINE

(71) Applicants: BOE Technology Group Co., Ltd., Beijing (CN); Hefei BOE Optoelectronics Technology Co., Ltd., Hefei (CN)

(72) Inventors: Liu Liu, Beijing (CN); Jinbao Peng, Beijing (CN); Pengcheng Shi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/747,567

(22) PCT Filed: May 3, 2017

(86) PCT No.: PCT/CN2017/082851
§ 371 (c)(1),
(2) Date: Jan. 25, 2018

(87) PCT Pub. No.: WO2017/206651
PCT Pub. Date: Dec. 7, 2017

(65) Prior Publication Data
US 2018/0210343 A1  Jul. 26, 2018

(30) Foreign Application Priority Data
May 31, 2016  (CN) .......................... 2016 1 0379882

(51) Int. Cl.
*G03F 7/20* (2006.01)
*H01L 21/677* (2006.01)

(52) U.S. Cl.
CPC ............ *G03F 7/20* (2013.01); *G03F 7/70733* (2013.01); *H01L 21/67748* (2013.01)

(58) Field of Classification Search
CPC ..... G03F 7/72; G03F 7/70733; G03F 7/70716
(Continued)

(56) References Cited

U.S. PATENT DOCUMENTS 8,497,980 B2   7/2013  Yamamoto
2008/0056857 A1*  3/2008  Hiroki ................... H01L 21/681
                                                    414/217.1
(Continued)

FOREIGN PATENT DOCUMENTS

CN    101351878 A    1/2009
CN    102077339 A    5/2011
(Continued)

OTHER PUBLICATIONS

First Office Action, including Search Report, for Chinese Patent Application No. 201610379882.6, dated May 3, 2017, 17 pages.
(Continued)

*Primary Examiner* — Hung Nguyen
(74) *Attorney, Agent, or Firm* — Westman, Champlin & Koehler, P.A.

(57) ABSTRACT

The present disclosure refers to a substrate supporting structure and an exposure machine. In one embodiment, the substrate supporting structure includes a plurality of lifting members and a first drive mechanism, top ends of the plurality of lifting members are in a same horizontal plane, and the first drive mechanism is capable of driving at least one of the lifting members to move horizontally. The substrate supporting structure according to the present disclosure is for supporting a substrate.

18 Claims, 5 Drawing Sheets

(58) Field of Classification Search
USPC .................................................. 355/72–76
See application file for complete search history.

(56) References Cited

U.S. PATENT DOCUMENTS

| | | |
|---|---|---|
| 2008/0309909 A1 | 12/2008 | Yamamoto |
| 2009/0314211 A1 | 12/2009 | Du Bois et al. |
| 2010/0030347 A1* | 2/2010 | Shindo .............. H01L 21/67259 700/59 |
| 2011/0141448 A1 | 6/2011 | Aoki et al. |
| 2013/0077080 A1 | 3/2013 | Yamamoto |
| 2015/0234282 A1* | 8/2015 | Hara .................... G03F 7/2041 355/67 |

FOREIGN PATENT DOCUMENTS

| | | |
|---|---|---|
| CN | 102696099 A | 9/2012 |
| CN | 102763209 A | 10/2012 |
| CN | 103534788 A | 1/2014 |
| JP | 2007-208054 A | 8/2007 |
| JP | 2008-235900 A | 10/2008 |
| TW | 200302507 A | 8/2003 |
| WO | 96/10469 A1 | 4/1996 |

OTHER PUBLICATIONS

International Search Report and Written Opinion for International Application No. PCT/CN2017/082851, dated Aug. 11, 2017, 10 pages.

English translation of International Search Report and Box V. of the Written Opinion for International Application No. PCT/CN2017/082851, dated Aug. 11, 2017, 4 pages.

* cited by examiner

SUBSTRATE SUPPORTING STRUCTURE AND EXPOSURE MACHINE

CROSS-REFERENCE TO RELATED APPLICATION

This application is a 371 National Stage application of International Application No. PCT/CN2017/082851, filed on May 3, 2017, published Dec. 7, 2017, and claims priority to Chinese Patent Application No. 201610379882.6 filed on May 31, 2016 in the State Intellectual Property Office of China, the present disclosures of which are hereby incorporated by reference in their entirety.

TECHNICAL FIELD

The present disclosure relates to technical field of mechanical equipment, and particularly, to a substrate supporting structure and an exposure machine.

BACKGROUND

A substrate supporting structure is provided in various equipment used in display panel production process, to support a substrate.

SUMMARY

In accordance with embodiments of a first aspect of the present disclosure, there is provided a substrate supporting structure, comprising: a plurality of lifting members, top ends of which being in a same horizontal plane, and a first drive mechanism capable of driving at least one of the lifting members to move horizontally.

According to some embodiments, the substrate supporting structure further comprises a base table, wherein, a sliding groove is formed in an upper surface of the base table, the plurality of lifting members are provided in the sliding groove, and the first drive mechanism is capable of driving the at least one of the lifting members to move horizontally in the sliding groove.

According to some embodiments, the substrate supporting structure further comprises a base table, and a second drive mechanism capable of driving the plurality of the lifting members or the base table to move in a vertical direction, to generate a relative displacement between the plurality of the lifting members and the base table; wherein, along with the movement of the plurality of the lifting members or of the base table in the vertical direction, top ends of the plurality of the lifting members can be higher than, flushed with or lower than the upper surface of the base table.

According to some embodiments, the substrate supporting structure further comprises a slideway and a plurality of sliders fitted in the slideway, the plurality of the lifting members being connected in a one-to-one correspondence with the plurality of sliders; wherein, the first drive mechanism is capable of driving at least one of the sliders to slide along the slideway, to drive the at least one of the lifting members to horizontally move in the sliding groove.

According to some embodiments, the slideway is fixedly provided, an upper surface of the slider is formed with an insertion groove in which at least a portion of the lifting member is inserted, and the lifting member is movable in the insertion groove in the vertical direction.

According to some embodiments, the substrate supporting structure further comprises a limiting structure capable of preventing the lifting member from horizontally moving in the insertion groove when the slider slides along the slideway.

According to some embodiments, the limiting structure comprises two conical surfaces, of which one is a side surface of the insertion groove while the other is a side surface of the lifting member; and, the side surface of the lifting member is abutted against the side surface of the insertion groove when the slider slides along the slideway.

According to some embodiments, the sliding groove comprises a plurality of cross grooves, and the plurality of lifting members are provided in the plurality of cross grooves in a one-to-one correspondence.

According to some embodiments, a plurality of supporting plates are provided in the sliding groove, and are hinged by a hinge shaft to a top end of a side wall of the sliding groove; the supporting plate is connected with a third drive mechanism capable of driving rotation of the supporting plate around the hinge shaft, and upon rotation of the supporting plate, an upper surface of the supporting plate can be flushed with the upper surface of the base table.

According to some embodiments, the base table is fixedly provided, and the second drive mechanism is connected with the lifting members.

According to some embodiments, the base table is formed therein with a receiving chamber communicated with the sliding groove, and both the first drive mechanism and the second drive mechanism are provided in the receiving chamber.

According to some embodiments, the top end of at least one of the lifting members is provided with an adsorption hole connected with a vacuum generator.

In accordance with embodiments of another aspect of the present disclosure, there is provided an exposure machine comprising the substrate supporting structure of any one of the abovementioned technical solutions.

DETAILED DESCRIPTION OF THE EMBODIMENTS

Technique solutions in embodiments of the present disclosure will be described clearly and completely hereinafter in detail with reference to the attached drawings in the embodiments of the present disclosure. Obviously, the described embodiments are only some of embodiments of the present disclosure, instead of all of the embodiments of the present disclosure. For those skilled in the art, all other embodiments achieved by referring to the embodiments of the present disclosure without involving any inventive steps fall into the scope of the present disclosure.

It should be noted that in the description of embodiments of the present disclosure, orientations or positional relationships denoted by terminologies "center", "upper", "lower", "front", "rear", "left", "right", "vertical", "horizontal", "top", "bottom", "inner", "outer" and the likes are based on those shown in the figures, and only intended for easing or simplifying the description of the present disclosure, instead of expressing or implying that the devices or elements to be denoted should be located at specific orientations or should be configured or manipulated at specific orientations, accordingly, they are not intended to limit the scope of the present disclosure.

Terminologies "first", "second" and "third" are adopted only for describing purposes, instead of expressing or implying relative importance or implying the number of the technical features to be denoted. Accordingly, the features defined with "first", "second" and "third" may explicitly or implicitly include one or more such features. In description of the present disclosure, unless otherwise specified and defined definitely, "plurality of" indicates two or more.

It should be noted that in the description of the present disclosure, unless otherwise specified and defined definitely, terminologies "mount", "connect to", "connect with" should be explained and construed in a broad sense, for example, it may be a fixed connection, or a detachable connection, or an integrated connection; or else, it may be a direct connection or an indirect connection with an intermediate medium; or else, it may be an internal communication between two components. For those skilled in the art, the above terminologies can be explained and construed in specific situations in the present disclosure.

Figure 1:
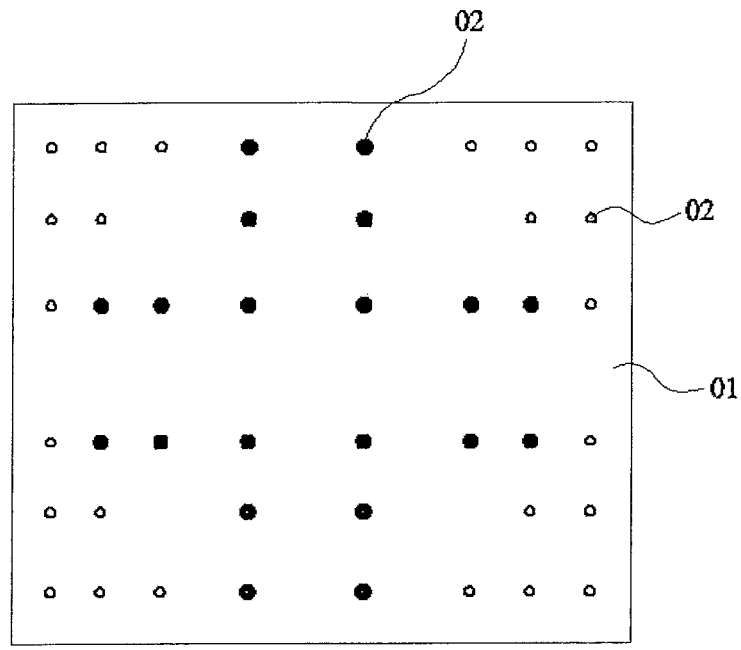
FIG. 1 is a top view showing a substrate supporting structure in related art.

FIG. 1 is a top view showing a substrate supporting structure in related art. Referring to FIG. 1, the substrate supporting structure in related art comprises a base table 01, an upper surface of the base table 01 is formed with a plurality of mounting holes, a lifting member 02 is provided in each mounting hole, and top ends of a plurality of the lifting members 02 are in a same horizontal plane.

It has been found by the inventor that, since the lifting member 02 is provided in the mounting hole of the base table 01, the lifting member 02 cannot move in a direction parallel to the upper surface of the base table 01, namely, a horizontal position of the lifting member 02 is immobilized. However, for different products, a display region and a non-display region of a substrate have different layouts, namely, the display region and the non-display region of the substrate have different positions, accordingly, for manufacturing different products, the lifting member 02 may support at the display region of the substrate and thereby leave a circular mark in the display region, which causes the yield of product is adversely influenced severely.

Figure 2:
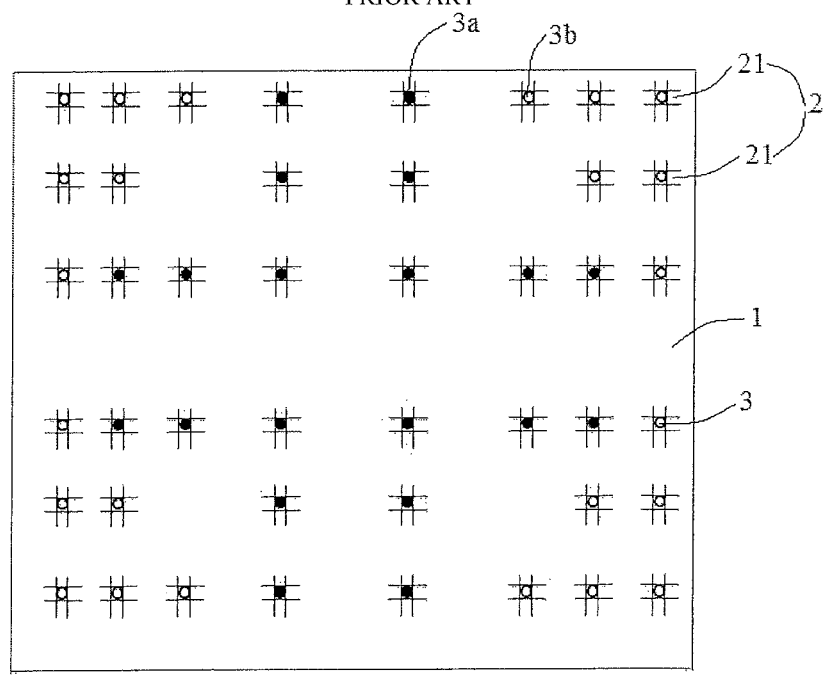
FIG. 2 is a top view showing a substrate supporting structure according to an embodiment of the present disclosure.
Figure 6:
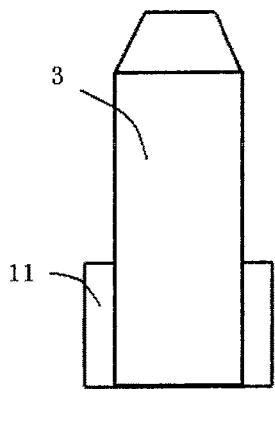
FIG. 6 shows a substrate supporting structure, referring to FIG. 2, including a plurality of lifting members and a first drive mechanism.

According to an embodiment of the present disclosure, there is provided a substrate supporting structure, referring to FIG. 2, comprising a plurality of lifting members 3 and a first drive mechanism 11 (shown in FIG. 6) corresponding to each of the lifting members 3, the first drive mechanism 11 is provided around each of the lifting members 3, top ends of the plurality of lifting members 3 are in a same horizontal plane, and the first drive mechanism 11 is capable of driving at least one of the lifting members 3 to move horizontally.

With the substrate supporting structure provided according to embodiments of the present disclosure, the first drive mechanism can drive at least one of the lifting members 3 to move horizontally, accordingly, for manufacturing different products, horizontal positions of the lifting members 3 can be adjusted according to positions of the display region and the non-display region of the substrate, to reduce the number of the lifting members 3 which support at the display region of the substrate, and thus to reduce the number of circular marks left by the lifting members 3 in the display region, thereby alleviating the problem of adversely influencing the yield of product.

It should be noted that, adjustment of horizontal positions of the lifting members 3 can be done according to the actual requirements, accordingly, the movement of the lifting members 3 paralleled with the upper surface of the base table 1 is a selective movement, that is, it may be movements of all of the lifting members 3, or may be movements of only some of the lifting members 3. Here, the first drive mechanism may include a motor and a gear and a rack engaged with each other, the gear is fitted over an output shaft of the motor while the rack is fitted in a rack track, and the lifting members are connected with the rack. When the motor is started, the output shaft of the motor drives the gear to rotate, and the gear drives the rack to translate in the rack track, and thus drives the lifting members to move horizontally.

Figure 7:
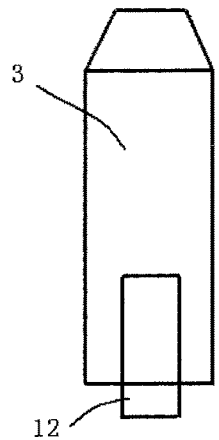
FIG. 7 shows a second drive mechanism corresponding to each of the lifting members.

In some embodiments, the substrate supporting structure further comprises a base table 1 and a second drive mechanism 12 (shown in FIG. 7) corresponding to each of the lifting members 3, the second drive mechanism 12 is provided in each of the lifting members 3, a sliding groove 2 is formed in an upper surface of the base table 1, the plurality of lifting members 3 are provided in the sliding groove 2, the first drive mechanism is capable of driving at least one of the lifting members 3 to move horizontally in the sliding groove 2, and the second drive mechanism is capable of driving the plurality of the lifting members 3 or the base table 1 to move in a vertical direction, to generate a relative displacement between the plurality of the lifting members 3 and the base table 1. Along with the movement of the plurality of the lifting members 3 or of the base table 1 in the vertical direction, top ends of the plurality of the lifting members 3 can be higher than, flushed with or lower than the upper surface of the base table 1. Here, the second drive mechanism may be a cylinder. Accordingly, once a substrate is placed, the plurality of the lifting members 3 or the base table 1 can be driven by the second drive mechanism to move in the vertical direction, so that the lifting members 3 ascend relative to the base table 1. When the top ends of the lifting members 3 are higher than the upper surface of the base table 1, the substrate is placed on the top ends of the lifting members 3, and then, the lifting members 3 or the base table 1 are/is driven by the second drive mechanism to move in the vertical direction, so that the lifting members 3 descend relative to the base table 1 until the substrate is placed on the upper surface of the base table 1, hereto, placement of the substrate is finished.

Figure 3:
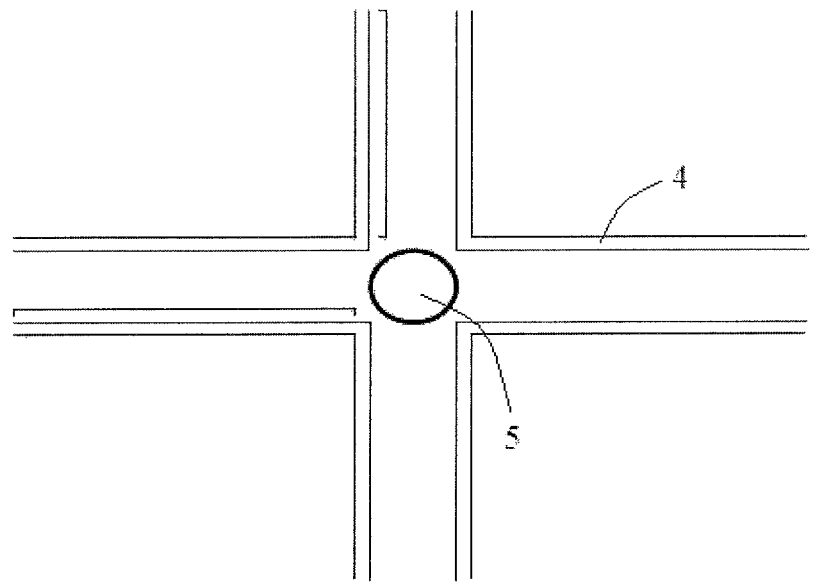
FIG. 3 is a schematic view showing a slideway and a slider in the substrate supporting structure according to the embodiment of the present disclosure.

In order to slide the lifting members 3 in the sliding groove 2 much more smoothly, while avoiding the lifting members 3 from being worn by side walls of the sliding groove 2 during sliding, referring to FIG. 3, the substrate supporting structure according to the present embodiment further comprises a slideway 4 and a plurality of sliders 5 fitted in the slideway 4, the plurality of the lifting members 3 are connected in a one-to-one correspondence with the plurality of sliders 5, and the first drive mechanism can drive at least one of the sliders 5 to move along the slideway 4, to drive the corresponding one of the lifting members 3 to horizontally move in the sliding groove 2, thereby slide movements of the lifting members 3 can be restricted by limiting slide movements of the sliders 5 by the slideway 4, to slide the lifting members 3 much more stably in the sliding groove 2. Based on this, there is no need that the side walls of the sliding groove 2 should be in contact with the lifting members 3, thereby avoiding the problem that the lifting members 3 are worn by rubbing the lifting members 3 with the side walls of the sliding groove 2 when the lifting members 3 slide in the sliding groove 2.

In the above embodiments, when the second drive mechanism drives the plurality of lifting members 3 to ascend or descend, since the lifting member 3 is connected with the slider 5 in the slideway 4, the slideway 4 and the slider 5 are required to ascend or descend together with the lifting member 3, which needs a required drive force to be increased and thus causes the cost of the second drive mechanism to be increased. In order to avoid the above problem, referring to FIG. 3 and FIG. 4, in the present embodiment, the slideway 4 is fixedly provided, the upper surface of the slider 5 is formed with an insertion groove 51, and at least a portion of the lifting member 3 is inserted into the insertion groove 51, and the lifting member 3 is movable in the insertion groove 51 in the vertical direction. Accordingly, when the plurality of the lifting members 3 are driven by the second drive mechanism to ascend or descend, there is no need that the slideway 4 and the slider 5 should ascend or descend together with the lifting member 3, but the lifting member 3 only needs to move upwardly and downwardly in the insertion groove 51 of the corresponding slider 5. Thereby, the problem that the required drive force should be increased and thus causes the cost of the second drive mechanism to be increased is avoided. Size of the insertion groove 51 may be set according to requirements as long as normal upward and downward movement of the lifting member 3 is satisfied.

In addition, the substrate supporting structure according to the present embodiment further comprises a limiting structure 6 capable of preventing the lifting member 3 from horizontally moving in the insertion groove 51 when the slider 5 slides along the slideway 4. That is to say, the limiting structure 6 can prevent the lifting member 3 from horizontally shaking relative to the slider 5, so that slide movements of the lifting members 3 can be restricted by limiting slide movements of the sliders 5 by the slideway 4, to slide the lifting members 3 much more stably in the sliding groove 2.

There are many embodiments of the limiting structure 6, for example, it may comprise an engagement block and an engagement slot, the engagement slot may be provided in a bottom surface of the insertion groove 51, and the engagement block is provided at a position of the lifting member 3 corresponding to the engagement slot. When the slider 5 slides along the slideway 4, the engagement block is fitted and engaged in the engagement slot. When the lifting member 3 moves upwardly and downwardly in the insertion groove 51, the engagement block slides out of the engagement slot.

The limiting structure 6 may also comprise two cylindrical surfaces, of which one is a side surface of the insertion groove 51 while the other is a side surface of the lifting member 3. The two cylindrical surfaces are abutted against each other when the slider 5 slides along the slideway 4. In this case, the lifting member 3 is fitted in the insertion groove 51.

Figure 4:
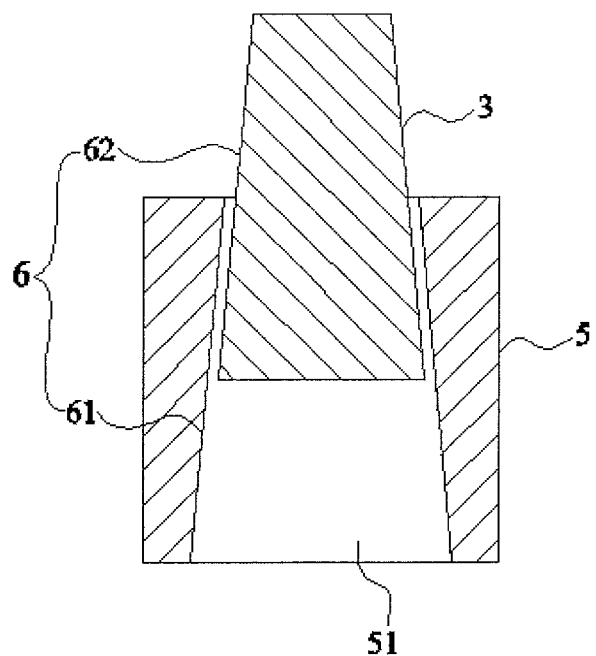
FIG. 4 is a schematic view showing an insertion groove in the substrate supporting structure according to the embodiment of the present disclosure.

Of course, the limiting structure 6 may further comprise two conical surfaces 61 and 62, referring to FIG. 4, one conical surface 61 is a side surface of the insertion groove 51 while the other conical surface 62 is a side surface of the lifting member 3. The two conical surfaces 61 and 62 are abutted against each other when the slider 5 slides along the slideway 4; and the two conical surfaces 61 and 62 are separated from each other when the lifting member 3 moves upwardly and downwardly in the insertion groove 51.

In the present embodiment, the limiting structure 6 may be the two conical surfaces 61 and 62. Since the two conical surfaces 61 and 62 are original surfaces of the insertion groove 51 and the lifting member 3, the process is simplified compared to the engagement block and the engagement slot. Since the two conical surfaces 61 and 62 are separated from each other when the lifting member 3 moves upwardly and downwardly in the insertion groove 51, abrasive wear suffered from upward and downward movement of the lifting member 3 can be reduced compared to the two cylindrical surfaces.

Referring to FIG. 2, the sliding groove 2 comprises a plurality of cross grooves 21, and the plurality of lifting members 3 are provided in the plurality of cross grooves 21 in a one-to-one correspondence. Thereby, moving directions of the lifting members 3 paralleled to the upper surface of the base table 1 are increased, which enables horizontal positions of the lifting members 3 to be adjusted more conveniently for productions of different products, and avoids the lifting member 3 to support at the display region of the substrate. In addition, compared to a reticulated sliding groove, the plurality of cross grooves 21 according to the present embodiment are not communicated with one another, which shortens length of the sliding groove and facilitates processing. The cross groove 21 comprises four groove sections, and the length of each groove section may be set according to actual requirements, for example, it may be set to be 120 mm.

Figure 5:
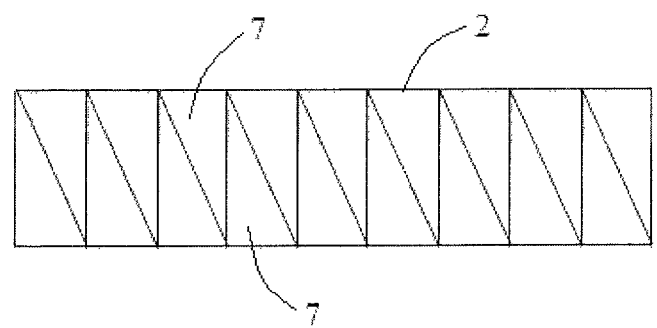
FIG. 5 is a schematic view showing a supporting plate in the substrate supporting structure according to the embodiment of the present disclosure.
Figure 8:
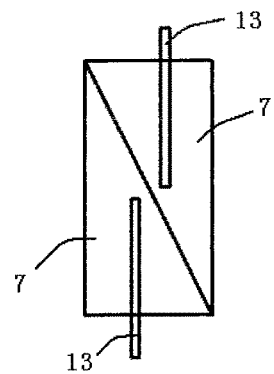
FIG. 8 a plurality of supporting plates connected with a third drive mechanism.

Referring to FIG. 2, after the substrate is placed on the upper surface of the base table 1, there is no support force at a location of the substrate corresponding to the sliding groove 2, and this location may sag under the action of gravity or other downward forces while other locations of the substrate may be warped, that is, the substrate may deform. In order to avoid the above problem, referring to FIG. 5, in the present embodiment a plurality of supporting plates 7 are provided in the sliding groove 2, and the supporting plates 7 are hinged by a hinge shaft to a top end of a side wall of the sliding groove 2, and the supporting plate 7 is connected with a third drive mechanism 13 (shown in FIG. 8) capable of driving rotation of the supporting plate 7 around the hinge shaft, and upon rotation of the supporting plate 7, an upper surface of the supporting plate 7 can be flushed with the upper surface of the base table 1. Thereby, when the lifting member 3 is selected to be at a horizontal position, location of the lifting member 3 in the sliding groove 2 is fixed. In this case, the supporting plate 7 corresponding to the lifting member 3, in the sliding groove 2 is in a state where the sliding groove 2 is opened, thereby avoiding an adverse impact on going up and down of the lifting member 3. The supporting plates 7 at the other positions in the sliding groove 2 are driven by the third drive mechanism to rotate around respective hinge shafts until upper surfaces of the supporting plates 7 at the other positions are flushed with the upper surface of the base table 1. It should be noted that, the supporting plates 7 at the other positions are those which bring no impact on going up and down of the lifting member 3 when the lifting member 3 is selected to be at the horizontal position. Accordingly, when the substrate is placed on the upper surface of the base table 1, the supporting plates 7 at the other positions can support locations of the substrate which may sag, thereby avoiding the problem that the substrate deforms.

When the sliding groove 2 comprises a plurality of cross grooves 21 and the plurality of the lifting members 3 are provided in the plurality of cross grooves 21 in a one-to-one correspondence, a plurality of supporting plates 7 are provided in each cross groove 21. After the lifting member 3 in an arbitrary one of the cross grooves 21 is selected to be at the horizontal position, the corresponding supporting plate 7 may be driven selectively by the third drive mechanism to rotate, thereby flexibly controlling an area of the substrate supported by the supporting plate 7. Specifically, a shape of the supporting plate 7 may be triangular shown in FIG. 5, or of course may be rectangular or other shapes, and it is not limited in the present disclosure. When the supporting plate 7 is in a triangular shape, two adjacent supporting plates 7 may be hinged with two opposite side walls of the sliding groove 2, respectively, so that opposite sides of the two adjacent triangular supporting plates 7 are contacted with each other, which reduces a gap between the two adjacent supporting plates 7, and thus enlarges the supporting area for the substrate. When the supporting plate 7 is in a rectangular shape or other shape, two adjacent supporting plates 7 may be hinged with two opposite side walls of the sliding groove 2, respectively, or two adjacent supporting plates 7 may be hinged with a same side wall of the sliding groove 2, in this case, opposite sides of the two adjacent rectangular supporting plates 7 may also be contacted with each other, which reduces a gap between the two adjacent supporting plates 7, and thus enlarges the supporting area for the substrate. There are also many options on size of the supporting plate 7 in a length direction of the sliding groove 2, for example, it may be 5 mm. Here, the third drive mechanism may also include a motor and a gear and a rack engaged with each other, the gear is fitted over an output shaft of the motor while the rack is fitted in a rack track, and the supporting plates are connected with the rack. When the motor is started, the output shaft of the motor drives the gear to rotate, and the gear drives the rack to translate in the rack track, and thus drives the supporting plates to rotate around their hinge shafts.

In the above embodiments, the second drive mechanism may drive the plurality of lifting members 3 to move in the vertical direction, or may drive the base table 1 to move in the vertical direction. When the second drive mechanism drives the base table 1 to move, the second drive mechanism is required to provide a relatively greater drive force due to relatively greater volume and weight of the base table 1, that is to say, there is a relatively higher requirements on performance of the second drive mechanism, which causes a relatively higher cost of the second drive mechanism. Accordingly, in the present embodiment, the base table 1 is fixedly provided and the second drive mechanism is connected with the lifting members 3, in this case, the second drive mechanism is for driving the lifting members 3 to move. As a result, the second drive mechanism is only required to provide a relatively smaller drive force, which reduces requirement on performance of the second drive mechanism and thus reduces the cost.

In order to reduce a volume of the substrate supporting structure, in the present embodiment, the base table 1 is formed therein with a receiving chamber communicated with the sliding groove 2, and both the first drive mechanism and the second drive mechanism are provided in the receiving chamber. Accordingly, the first drive mechanism and the second drive mechanism can be prevented from occupying additional space, thereby reducing the volume of the substrate supporting structure.

It should be noted that, provided that the substrate supporting structure comprises the slideway 4, the slideway 4 may be placed in the receiving chamber.

Figure 9:
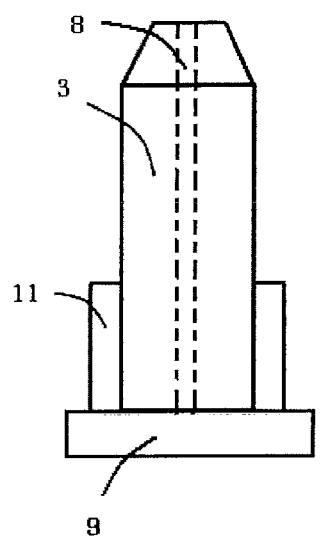
FIG. 9 shows an embodiment in which the top end of at least one of the lifting members is provided with an adsorption hole connected with a vacuum generator.

In order to ensure process precision, referring to FIG. 2, in the present embodiment, the top end of at least one of the lifting members 3 is provided with an adsorption hole connected with a vacuum generator, here, the vacuum generator may be a vacuum pump or an extractor fan. Accordingly, the vacuum generator is started when a substrate is placed on the top ends of the plurality of lifting members 3. The vacuum generator creates a negative pressure between a lower surface of the substrate and the lifting members 3 by drawing out gas between the lower surface of the substrate and the lifting members 3 through the adsorption hole, to absorb the substrate, which avoids offset of location of the substrate and thus ensures the process precision. FIG. 9 shows an embodiment in which the top end of at least one of the lifting members 3 is provided with an adsorption hole 8 connected with a vacuum generator 9.

Top surface of the lifting member 3 may be round, the lifting member 3b provided with no adsorption hole may have a diameter of 4 mm in its top surface and a height of 5 mm, and the lifting member 3a provided with the adsorption hole may have a diameter of 8 mm in its top surface and a height of 10 mm.

According to an embodiment of the present disclosure, there is further provided an exposure machine comprising the substrate supporting structure according to any one of the above embodiments.

Other constituents of the exposure machine according to embodiments of the present disclosure are well known for those skilled in the art and thus are not described in detail herein.

In the exposure machine according to embodiments of the present disclosure, since the first drive mechanism can drive at least one of the lifting members 3 to move horizontally, accordingly, for manufacturing different products, horizontal positions of the lifting members 3 can be adjusted according to positions of the display region and the non-display region of the substrate, to reduce the number of the lifting members 3 which support at the display region of the substrate, and thus to reduce the number of circular marks left by e lifting members 3 in the display region, thereby alleviating the problem of adversely influencing the yield of product.

The above are merely specific embodiments of the present disclosure, and protective scope of the present disclosure is not limited to these. For those skilled in the art, any changes or replacements that can be envisaged easily in the technical scope of disclosure of the present disclosure should be within the protective scope of the present disclosure. Therefore, the scope of the present disclosure is defined in the claims and their equivalents.

What is claimed is:
1. A substrate supporting structure, comprising:
a plurality of lifting members, top ends of which being in a same horizontal plane,
a first drive mechanism capable of driving at least one of the lifting members to move horizontally;

a base table, wherein, a sliding groove is formed in an upper surface of the base table, the plurality of lifting members are provided in the sliding groove; and a slideway and a plurality of sliders fitted in the slideway, wherein, the plurality of the lifting members are connected in a one-to-one correspondence with the plurality of sliders;

wherein, the first drive mechanism is capable of driving at least one of the sliders to slide along the slideway, to drive the at least one of the lifting members to horizontally move in the sliding groove.

2. The substrate supporting structure of claim 1, further comprising a second drive mechanism capable of driving the plurality of the lifting members or the base table to move in a vertical direction, to generate a relative displacement between the plurality of the lifting members and the base table;

wherein, along with the movement of the plurality of the lifting members or of the base table in the vertical direction, top ends of the plurality of the lifting members can be higher than, flushed with or lower than the upper surface of the base table.

3. The substrate supporting structure of claim 1, wherein, the slideway is fixedly provided, an upper surface of the slider is formed with an insertion groove in which at least a portion of the lifting member is inserted, and the lifting member is movable in the insertion groove in the vertical direction.

4. The substrate supporting structure of claim 3, further comprising a limiting structure capable of preventing the lifting member from horizontally moving in the insertion groove when the slider slides along the slideway.

5. The substrate supporting structure of claim 4, wherein, the limiting structure comprises two conical surfaces, of which one is a side surface of the insertion groove while the other is a side surface of the lifting member; and, the side surface of the lifting member is abutted against the side surface of the insertion groove when the slider slides along the slideway.

6. The substrate supporting structure of claim 1, wherein, the sliding groove comprises a plurality of cross grooves, and the plurality of lifting members are provided in the plurality of cross grooves in a one-to-one correspondence.

7. The substrate supporting structure of claim 1, wherein, a plurality of supporting plates are provided in the sliding groove, and are hinged by a hinge shaft to a top end of a side wall of the sliding groove;

the supporting plate is connected with a third drive mechanism capable of driving rotation of the supporting plate around the hinge shaft, and upon rotation of the supporting plate, an upper surface of the supporting plate can be flushed with the upper surface of the base table.

8. The substrate supporting structure of claim 2, wherein, the base table is fixedly provided, and the second drive mechanism is connected with the lifting members.

9. The substrate supporting structure of claim 8, wherein, the base table is formed therein with a receiving chamber communicated with the sliding groove, and both the first drive mechanism and the second drive mechanism are provided in the receiving chamber.

10. The substrate supporting structure of claim 1, wherein, the top end of at least one of the lifting members is provided with an adsorption hole connected with a vacuum generator.

11. An exposure machine comprising the substrate supporting structure of claim 1.

12. The exposure machine of claim 11, wherein, the substrate supporting structure further comprises a second drive mechanism, wherein, the second drive mechanism is capable of driving the plurality of the lifting members or the base table to move in a vertical direction, to generate a relative displacement between the plurality of the lifting members and the base table; wherein, along with the movement of the plurality of the lifting members or of the base table in the vertical direction, top ends of the plurality of the lifting members can be higher than, flushed with or lower than the upper surface of the base table.

13. The exposure machine of claim 12, wherein, the slideway is fixedly provided, an upper surface of the slider is formed with an insertion groove in which at least a portion of the lifting member is inserted, and the lifting member is movable in the insertion groove in the vertical direction.

14. The exposure machine of claim 13, wherein, the substrate supporting structure further comprises a limiting structure capable of preventing the lifting member from horizontally moving in the insertion groove when the slider slides along the slideway;

wherein, the limiting structure comprises two conical surfaces, of which one is a side surface of the insertion groove while the other is a side surface of the lifting member; and, the side surface of the lifting member is abutted against the side surface of the insertion groove when the slider slides along the slideway.

15. The exposure machine of claim 12, wherein, the sliding groove comprises a plurality of cross grooves, and the plurality of lifting members are provided in the plurality of cross grooves in a one-to-one correspondence.

16. The exposure machine of claim 12, wherein, a plurality of supporting plates are provided in the sliding groove, and are hinged by a hinge shaft to a top end of a side wall of the sliding groove;

the supporting plate is connected with a third drive mechanism capable of driving rotation of the supporting plate around the hinge shaft, and upon rotation of the supporting plate, an upper surface of the supporting plate can be flushed with the upper surface of the base table.

17. The exposure machine of claim 11, wherein, in the substrate supporting structure, the base table is fixedly provided, and the second drive mechanism is connected with the lifting members; and wherein, the base table is formed therein with a receiving chamber communicated with the sliding groove, and both the first drive mechanism and the second drive mechanism are provided in the receiving chamber.

18. The exposure machine of claim 11, wherein, in the substrate supporting structure, the top end of at least one of the lifting members is provided with an adsorption hole connected with a vacuum generator.

* * * * *